US006892344B2

(12) United States Patent
Becker

(10) Patent No.: US 6,892,344 B2
(45) Date of Patent: May 10, 2005

(54) VITERBI EQUALIZER USING VARIOUS HARDWARE DATA PATHS FOR ACS AND TRANSMISSION METRIC OPERATIONS

(75) Inventor: Burkhard Becker, Ismaning (DE)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/336,580

(22) Filed: Jan. 2, 2003

(65) Prior Publication Data

US 2003/0103587 A1 Jun. 5, 2003

Related U.S. Application Data

(63) Continuation of application No. PCT/DE01/02464, filed on Jun. 29, 2001.

(30) Foreign Application Priority Data

| Jul. 3, 2000 | (DE) | ......................................... 100 32 237 |
| Jun. 6, 2001 | (DE) | ......................................... 101 27 348 |
| Jun. 13, 2001 | (DE) | ......................................... 201 09 857 |

(51) Int. Cl.[7] ...................... H03M 13/25; H03M 13/23
(52) U.S. Cl. ...................... 714/794; 714/795; 714/796
(58) Field of Search ................................. 714/794–796

(56) References Cited

U.S. PATENT DOCUMENTS

| 5,502,735 | A | | 3/1996 | Cooper |
| 5,537,445 | A | | 7/1996 | Blaker et al. |
| 5,539,780 | A | | 7/1996 | Dutkiewicz |
| 5,724,394 | A | * | 3/1998 | Ikeda et al. ................... 375/341 |
| 5,905,757 | A | | 5/1999 | Kundmann et al. |
| 6,195,782 | B1 | | 2/2001 | Rahmatullah et al. |
| 2002/0083396 | A1 | * | 6/2002 | Azadet et al. .............. 714/796 |

FOREIGN PATENT DOCUMENTS

| DE | 195 11 015 A1 | 9/1996 |
| EP | 0 590 597 A2 | 4/1994 |
| EP | 0 632 623 A2 | 1/1995 |
| EP | 0 899 887 A2 | 3/1999 |
| WO | WO 02/03637 A1 * | 1/2002 ........... H04L/25/03 |

OTHER PUBLICATIONS

Osborne, W. et al.; Performance of trellis coded modulation with 8PSK through TDRSS; MILCOM '93. Conference record. 'Communications on the Move'., IEEE, vol.: 3 , Oct. 11–14, 1993; pp.: 963–967 vol. 3.*
Raphaeli D. et al.: "A Reduced Complexity Algorithm for Combined Equalization and Decoding for Channels with Multipath, ISI or Partial Response", IEEE Global Telecommunications Conference, Singapore, Nov. 14–16, 1995, vol. 1, pp. 83–87.
Erfanian J.A. et al.: "Reduced Complexity Symbol Detectors with Parallel Structures", New York, IEEE, vol. 2, Dec. 2, 1990, pp. 704–708.
Tietze U. et al.: "RAM als Schieberegister", [RAM as Shift Register], 10th edition, 1993, Springer Verlag, pp. 284–285.
Jung Peter: "Entwurf und Realisierung von Viterbi–Detektoren für Mobilfunkkanäle", [Layout and Realization of Viterbi–Detectors for Mobile Radio Channels], VDI Verlag, 1993, No. 238, pp. 91–111.
Forney G.D.: "The Viterbi Algorithm", IEEE, Mar. 1973, vol. 61, No. 3, pp. 268–278.

* cited by examiner

*Primary Examiner*—R. Stephen Dildine
(74) *Attorney, Agent, or Firm*—Laurence A. Greenberg; Werner H. Stemer; Ralph E. Locher

(57) ABSTRACT

A Viterbi equalizer includes a digital signal processor with has a first and a second associated hardware data path. The first data path is intended for carrying out ACS operations and calculates state metrics of target states in a trellis diagram. Depending on the configuration, the second hardware data path calculates either transition metrics from previous states to target states in the trellis diagram, or soft output values.

21 Claims, 4 Drawing Sheets

VITERBI EQUALIZER USING VARIOUS HARDWARE DATA PATHS FOR ACS AND TRANSMISSION METRIC OPERATIONS

CROSS-REFERENCE TO RELATED APPLICATION

This application is a continuation of copending International Application No. PCT/DE01/02464, filed Jun. 29, 2001, which designated the United States and was not published in English.

BACKGROUND OF THE INVENTION

Field of the Invention

The invention relates to a Viterbi equalizer for equalizing a symbol sequence that is transmitted via a channel that is subject to interference.

In the field of mobile radio, data signals that are transmitted via the air interface must be subjected to adaptive equalization. This is because the characteristics of the physical transmission channels vary constantly due to diffraction, scatter and reflection of the transmitted signals.

It is already known for Viterbi equalizers to be used for equalizing received signals. Viterbi equalizers are recursive MLSE (Maximum Likelihood Sequence Estimation) sequence estimators. Sequence estimation is based on finding the shortest route through a trellis diagram—that is to say through a diagram in which channel states are plotted against the discrete time. In this case, in accordance with the Viterbi algorithm, a transition metric that represents a measure of the probability of this transition is calculated for each transition between a specific target state in a time step under consideration and the possible previous states in the previous time step. The transition metrics are then added to the respective state metrics of the previous states (so-called "ADD" operations) and the sums obtained in this way are compared (so-called "COMPARE" operations). The particular transition having a minimum sum of the transition metric and the metric of the previous state is selected (so-called "SELECT" operations), and forms the extension of the path already determined to that target state. These three operations are referred to as ACS (Add-Compare-Select) operations.

Since each transition between a previous state and a target state has an associated data symbol which produces the transition, the process of finding the shortest path through the trellis diagram also results in the determination of the sequence of the transmitted data symbols.

One already known extension of the Viterbi algorithm (VA) is, in addition to producing such "hard-determined" data symbols, to also emit reliability information that indicates the confidence of the hard decision that is being made, and which can thus be used in an advantageous manner in subsequent decoders. An output such as this is referred to as a soft output.

In a Viterbi algorithm which originates from a reduced trellis diagram (that is to say a trellis diagram in which only some of the possible channel states are considered), the target state must also be recalculated once the transition which leads to it has been found.

European Patent Application EP 0 632 623 A2 describes an adaptive sequence estimator that operates using the Viterbi algorithm. The sequence estimator includes a unit for calculating the transition metric values, and which is formed from four hardware data paths connected in series.

U.S. Pat. No. 5,502,735 describes a sequence estimator that includes a hardware data path for carrying out ACS operations, a hardware data path for calculating transition metrics, and a data path for calculating soft output values. All of the data paths are designed for processing 2-value symbols.

For higher-stage data signals, the computation complexity of a Viterbi equalizer increases drastically. While GSM (Global System for Mobile Communications) uses a two-stage data signal, the new EDGE (Enhanced Data Services for GSM Evolution) standard is based on the 8PSK (Phase Shift Keying) modulation method, which is dependent on an 8-stage data signal. This means that 8 (GSM: only 2) state transitions originate from each trellis state, and that 8 (GSM: only 2) state transitions end in each trellis state.

The ACS operations for processing the Viterbi algorithm may be carried out in a suitably programmed DSP (Digital Signal Processor). However, this has the disadvantage that a high computation power level is required, which is in the order of magnitude of 400 MIPS (million instructions per second) or more. In addition to the disadvantage that computation power levels such as these are achieved only by using expensive processors, one particular problem that also arises in the mobile radio field is that high computation power levels always result in a high power consumption. However, this is unacceptable in mobile radio telephones because of the restricted energy resources.

SUMMARY OF THE INVENTION

It is accordingly an object of the invention to provide a Viterbi equalizer that overcomes the above-mentioned disadvantages of the prior art apparatus of this general type.

It is an object of the invention to provide a Viterbi equalizer in which computation-intensive processing steps are carried out while conserving resources as much as possible. In particular, the Viterbi equalizer is intended to be suitable for equalizing 8PSK data symbols in accordance with the EDGE standard.

With the foregoing and other objects in view there is provided, in accordance with the invention, a Viterbi equalizer for equalizing a received 8PSK symbol sequence that has been transmitted via a channel subject to interference. This equalizer has a digital signal processor including: a first hardware data path configured for carrying out ACS operations and for calculating state metrics of 8PSK target states in a trellis diagram; and a second hardware data path configured for taking account of channel characteristics when using the received symbol sequence to calculate transition metrics from 8PSK previous states to the 8PSK target states in the trellis diagram.

With the foregoing and other objects in view there is also provided, in accordance with the invention, a Viterbi equalizer for equalizing a received 8PSK symbol sequence that has been transmitted via a channel subject to interference. This equalizer has a digital signal processor including: a first hardware data path configured for carrying out ACS operations and for calculating state metrics of 8PSK target states in a trellis diagram; and a third hardware data path configured for calculating soft output values for an 8PSK symbol sequence estimated from state transitions that lead to the 8PSK target states.

According to a first aspect of the invention, the Viterbi equalizer is equipped with a first hardware data path for carrying out ACS operations, which calculates state metrics of 8PSK target states in a trellis diagram, and with a second hardware data path which, taking account of the channel characteristics, uses the received 8PSK symbol sequence to calculate transition metrics from 8PSK previous states to 8PSK target states in the trellis diagram. The implementation of these two data paths means that the corresponding calculation steps are processed by hardware and thus do not consume any computation capacity in the DSP.

A second aspect of the invention relates to a Viterbi equalizer which is equipped with a first hardware data path for carrying out ACS operations, which calculates state metrics of 8PSK target states in a trellis diagram, and with a third hardware data path, which calculates soft output values for the 8PSK symbol sequence to be estimated from the state transitions which lead to the 8PSK target states. In this case as well, the load on the digital signal processor is effectively reduced by using two hardware data paths to assist the Viterbi equalization.

Advantageous embodiment variants of these two aspects of the invention are characterized in that the two respective hardware data paths are connected directly to one another, that is to say without any intermediate processing in the digital signal processor of the data calculated in the respective upstream hardware data path. In this case, the transition metrics calculated in the second hardware data path are transmitted directly to the first hardware data path, and data calculated in the first hardware path is transferred directly to the third hardware data path. Thus, in this case, the digital signal processor is not required for carrying out intermediate calculation steps, thus making it possible to save processing time and computation power. With reference to the two data paths, the object of the digital signal processor is then only to provide suitable sequence control and time coordination of the data paths under consideration.

One particularly preferred refinement of the invention is for both data paths to be designed to carry out not only equalization in accordance with the EDGE mobile radio standard but also equalization in accordance with the GSM mobile radio standard. This means that, in addition to the 8PSK-modulated 8-stage data symbols, GMSK-modulated 2-stage data symbols can also be processed in the respective hardware data paths. In consequence, the Viterbi equalizer can optionally be operated in accordance with the EDGE standard or in accordance with the GSM standard.

In order to reduce the load on the digital signal processor further, a fourth hardware data path is preferably provided for calculation of the 8PSK target state vectors (that is to say additional information relating to target states) in the trellis diagram, and/or a fifth hardware data path is provided for calculation of determined 8PSK data symbols.

One particularly preferred embodiment of the first hardware data path for carrying out ACS operations is characterized in that this first hardware data path has a first minimization stage in which the minimum of the sums from metrics and transition metrics of at least two state transitions is determined, and has a second minimization stage, which is connected downstream from the first minimization stage and which, by sequential processing, determines the minimum of the sums emitted from the first minimization stage. This results in the "COMPARE" step in the ACS operation being carried out partially in parallel and partially sequentially, thus assisting not only the comparison of two state transitions (in the case of GSM), but also the comparison of eight state transitions (in the case of EDGE).

Other features which are considered as characteristic for the invention are set forth in the appended claims.

Although the invention is illustrated and described herein as embodied in a viterbi equalizer using various hardware data paths for ACS and transmission metric operations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
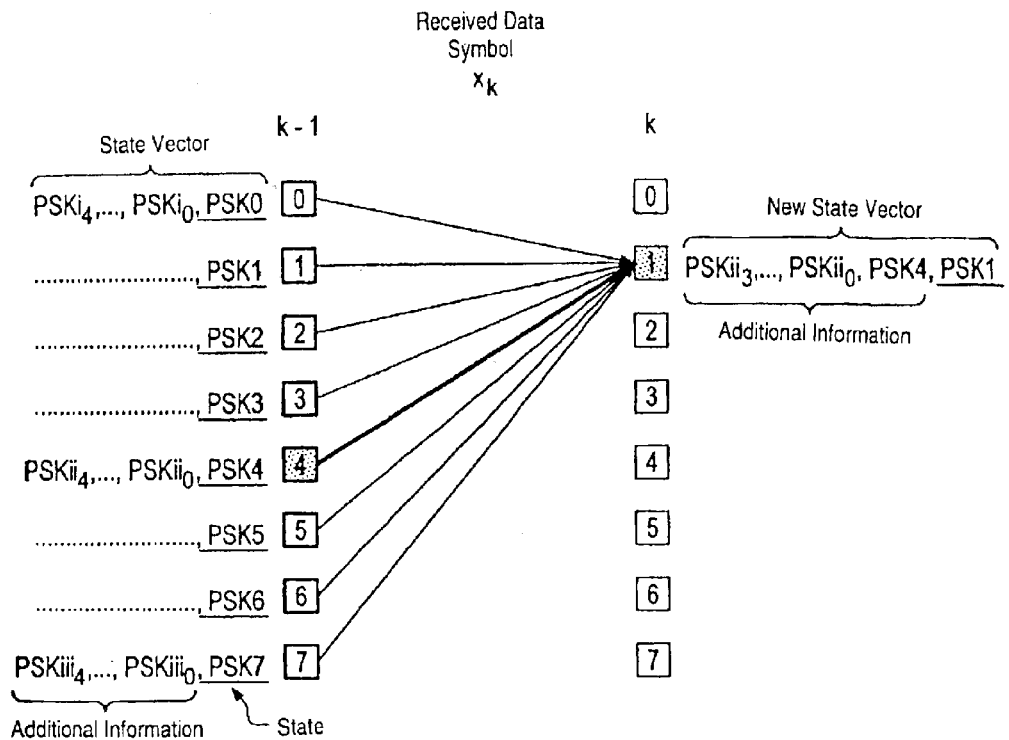
FIG. 1 is a detail from a trellis diagram including two successive time steps k−1 and k for EDGE equalization.

Before describing an exemplary embodiment of an inventive Viterbi equalizer, the principle of Viterbi equalization will first be explained briefly in order to provide a better understanding of the principle.

Based on a known equivalent circuit, the time-variant mobile radio channel can be modeled using a shift register with v memory cells, v+1 taps before, between and after the memory cells, multipliers for multiplying the data symbols provided at the taps by time-variant channel parameters (of which there are v+1) and an adder at the output. The number v of memory cells is referred to as the channel memory.

In this channel model, the instantaneous state of the channel is described uniquely by the occupancy of the shift register. In the case of 8PSK data symbols, there are $8^v$ possible channel states (occupancies of the shift register), while there are only $2^v$ for GMSK data symbols.

A state diagram of the channel, in which channel states are plotted against the discrete time kT, is referred to as a trellis diagram. T denotes the symbol time duration and k denotes the index of the time step under consideration.

The transmission of a data symbol via the mobile radio channel corresponds to this data symbol being entered in the shift register in the equivalent circuit. The channel (the shift register) then changes its state (its occupancy)—that is to say it changes from its previous state to a state (target state) that is determined uniquely by the transmitted data symbol.

A transmitted data symbol sequence thus predetermines a route through the trellis diagram. This route is also referred to as the shortest route through the trellis diagram, since this satisfies the minimum condition:

$$\sum_{k=0}^{L+v} \left( x_k - \sum_{l=0}^{v} a_{k-l} h_l \right)^2 = \text{Minimum} \quad (1)$$

In this case, $x_k$ denotes the data symbols received by the receiver, $h_0, h_1, \ldots, h_v$ denotes the channel impulse responses of the transmission channel, $a_k$ denotes the transmitted data symbols, and L+1 denotes the length (the number of elements) of the transmitted data symbol sequence.

The transmitted data symbol sequence and the shortest route as determined by it through the trellis diagram are unknown in the receiver. However, as soon as the shortest route through the trellis diagram is determined at the receiver end, the sequence of the transmitted data symbols is also determined. The Viterbi algorithm is based on the step-by-step recursive determination of this shortest route through the trellis diagram.

In general, the Viterbi algorithm determines the respective possible previous states relating to the time step k–1 for each target state relating to the time step k (that is to say those states which can change to the target state under consideration by transmission of a data symbol), and a transition metric is calculated for each of these state transitions. The transition metrics are then added to the metrics (already calculated in the previous recursion step) of the relevant previous states, and the sums of the metrics and transition metrics formed in this way are compared with one another. The smallest of these sums is determined as the metric of the target state, and this selection then also defines the appropriate previous state and the associated state transition. This is the only route through the trellis diagram which "survives" and continues to the target state, and the other routes terminate.

For Viterbi equalization of higher-stage signals, for example 8PSK-modulated signals in accordance with the EDGE standard, a reduced trellis diagram is used since, otherwise, the calculation complexity could not be coped with. For the 8PSK modulation method, the modulation alphabet includes 8 data symbols, which would mean that 8 possible transitions would need to be considered for each target state for a channel memory length of, for example, v=6 (a quantity of $8^6$) and it would also in each case be necessary to determine the possible previous states for each of the $8^6$ target states in advance. This is far greater than the currently available computation power levels.

The following example is based on 8PSK modulation of a (drastically) reduced trellis diagram, which takes account of only 8 states. Only 64 transition metrics (8 target states, which can each be reached via 8 transitions) therefore need to be calculated for each time step.

The 8PSK data symbols are referred to as PSK0, PSK1, PSK2, ..., PSK7. As is known, their definition is: PSKi=exp(j*i*2π/8), i=0, ..., 7; j is the imaginary unit.

Each state of the channel can be identified by the data symbol stored most recently in the memory cell on the input of the shift register. For v=6, it also contains the information about the last five previous states. A channel state can accordingly be specified by a 6-component state vector: PSKe, PSKd, PSKc, PSKb, PSKa, PSKp where a, b, c, d, e, p=0, ..., 7. In this case, the index k indicating the time step is omitted, in order to simplify the notation. The underscoring indicates the most recently obtained data symbol PSKp which determines the state, and the five previously obtained data symbols, which are not underscored, can be regarded as additional information relating to this state which, as will be explained in the following text, is relevant only when calculating the transition metrics values.

FIG. 1 shows the eight states relating to the time step k–1 and the eight states relating to the time step k, using small boxes numbered successively from 0 to 7. These state numbers are referred to as the indices of the states. Furthermore, the state vectors of the states relating to the time step k–1 are shown. By way of example, the state with the index 4 (which corresponds to PSK4) was reached in the time step k–1 via the previous states PSKii$_0$, PSKii$_1$, PSKii$_2$, PSKii$_3$, PSKii$_4$, that is to say the state vector for this state is:

PSKii$_4$, PSKii$_3$, PSKii$_2$, PSKii$_1$, PSKii$_0$, PSK4.

FIG. 1 shows the transitions from all the states relating to the time step k–1 to a specific target state relating to the time step k, that is to say the state with the index 1. The additional information relating to the target state with the index 1 relating to the time step k is dependent on the respective transition under consideration, since this governs the additional information for this state. For the transition, which is indicated by thick arrow, from the state with the index 4 relating to the time step k–1 to the state with the index 1 relating to the time step k, the additional information is PSKii$_3$, PSKii$_2$, PSKii$_1$, PSKii$_0$, PSK4.

A state vector relating to the state with the index m in the time step k is abbreviated in the following text to Z$_k$(m).

The transition metrics for the state transition under consideration from the previous state with the index 4 (time step k–1) to the target state with the index 1 (time step k) is calculated from the Euclidean distance between the received data symbol $x_k$ and the convolution product of the estimated channel impulse responses and the 8PSK symbols (a quantity of 6) associated with this previous state, as well as the transition data symbol (in this case: PSK1):

$$I_k(4 \to 1) = \left( x_k - \sum_{j=0,1,2,3,4} PSKii_j * h_{j+2} - PSK4 * h_1 - PSK1 * h_0 \right)^2 \quad (2)$$

The transition metrics $I_k(m \to 1)$ relating to the transitions from the other possible previous states m=0, 1, 2, 3, 5, 6, 7 relating to the time step k–1 to the specific target state with the index 1 relating to the time step 1 are calculated analogously. The notation $I_k(m \to m')$ in the following text is intended in general to denote the transition metrics for a state transition from the state m relating to the time step k–1 to the target state m' relating to the target step k, m'=0, ..., 7.

The metrics of the states m=0, ..., 7 relating to the time step k are referred to as M$_k$(m). In the described recursion step in the Viterbi algorithm, all the metrics M$_{k-1}$(m) for the k-th time step are known, and the metrics M$_k$(m) must be calculated.

In accordance with the general explanatory notes above, the calculated transition metrics $I_k(m \to m')$ are now added in the addition step ("ADD") in the ACS operation to the already calculated metrics M$_{k-1}$(m) for the previous states, that is to say the sum M$_{k-1}$(m)+$I_k(m \to 1)$ is formed for the target state m=1 relating to the time step k. In the comparison step ("COMPARE"), the sum with the smallest value is found, and is defined as the metrics M$_k$(1) of the target state. In the example under consideration, this should be the metrics value which results for the transition, shown in bold, from the state with the index 4 relating to the time step k–1 to the target state 1 under consideration relating to the time step k. The selection of this most probable previous state with the state vector $PSKii_4, \ldots, PSKii_0$, PSK4 allows the new state vector for the state with the index 1 relating to the time step k to be formed. This is:

$PSKii_3$, $PSKii_2$, $PSKii_1$, $PSKii_0$, PSK4, PSK1.

Once the ACS operations relating to all the states in the time step k have been carried out, all the state vectors (a quantity of 8) for these states are also determined.

In the described example, transitions are possible between all the states. This is a necessary consequence of the fact that, with an 8-stage symbol alphabet, eight transitions lead to each target state, and in the reduced, trellis diagram considered here, only eight channel states are considered. The choice of a reduced trellis diagram with only 8 states is, however, not a precondition for the invention, and it is also possible to process the Viterbi algorithm on the basis of a trellis diagram that has not been reduced to such a major extent and has more than 8 states.

Figure 2:
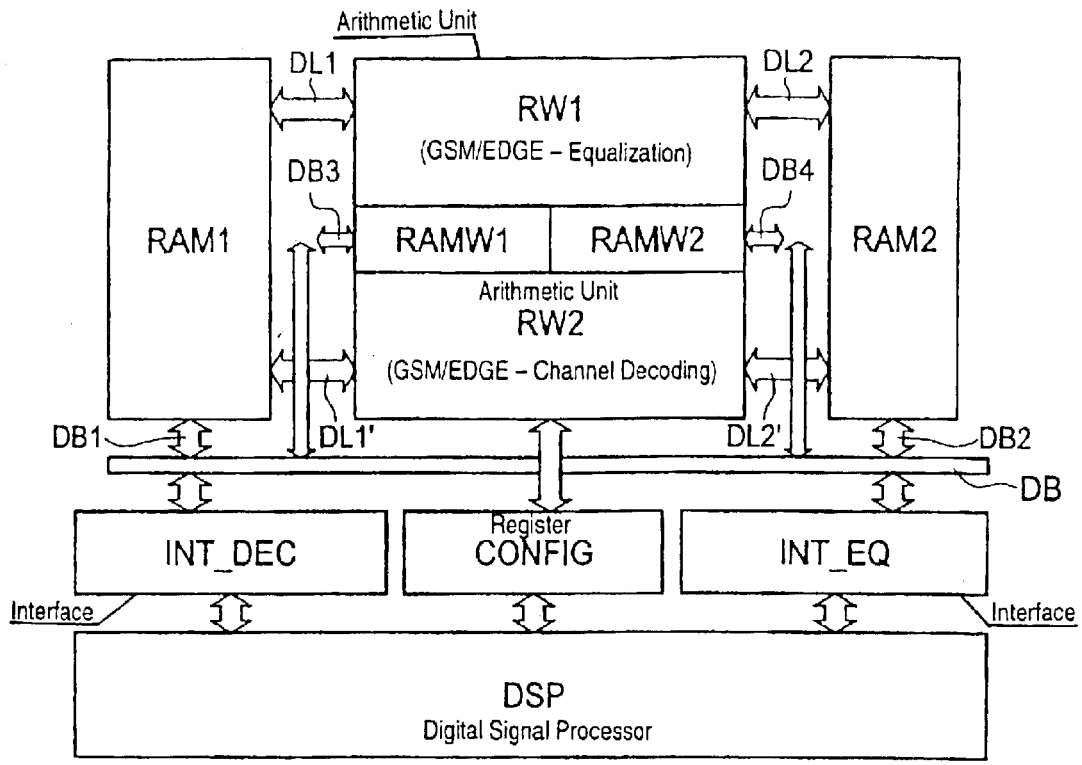
FIG. 2 is a diagram of the architecture of a receiver circuit with an inventive Viterbi equalizer.

FIG. 2 is a block diagram showing the architecture of a receiver circuit with an inventive equalizer and data links (data buses) between the function blocks. The central component of the circuit is a digital signal processor DSP which is connected, such that data can be interchanged, to two arithmetic units RW1 and RW2 via one or more configuration registers CONFIG. The first arithmetic unit RW1 is used for equalization of a received data signal, that is to say it reverses the signal distortion which has occurred during the transmitter-end modulation and transmission of the modulated signal via the air interface. The second arithmetic unit RW2 carries out channel decoding, that is to say this circuit removes the redundancy which was added to the transmitted signal during the transmitter-end channel coding, before the signal was modulated onto a suitable carrier. The arithmetic units RW1 and RW2 can carry out equalization and channel decoding in accordance, for example, not only with the GSM standard but also with the EDGE standard.

The first arithmetic unit RW1 is connected, such that data can be interchanged, via a first bidirectional data link DL1 to a first volatile data memory RAM1, and via a second bidirectional data link DL2 to a second volatile data memory RAM2. Corresponding third and fourth bidirectional data links DL1', DL2' are provided between the second arithmetic unit RW2 and the first data memory RAM1, as well as between the second arithmetic unit RW2 and the second data memory RAM2.

The first arithmetic unit RW1 is connected in a manner which will be described in more detail to two volatile data memories RAMW1 and RAMW2. The second arithmetic unit RW2 also accesses the data memories RAMW1 and RAMW2. All the internal data memories RAM1, RAM2 and RAMW1, RAMW2 can be written to and also read from in order to program the arithmetic units RW1, RW2 and in order to initialize the digital signal processor DSP. The access from the DSP takes place via two interfaces INT_DEC AND INT_EQ via a central data bus DB and via the internal data buses DB1 (RAM1), DB2 (RAM2), DB3 (RAMW1) and DB4 (RAMW2). The interface INT_DEC is intended for access of the DSP during a channel decoding process, and the interface INT_EQ is intended for access of the DSP during an equalization process.

The arithmetic units RW1, RW2, the data memories RAM1, RAM2, RAMW1 and RAMW2 as well as the data buses DB3, DB4 and the data links DL1, DL2, DL1', DL2' can be physically combined in the form of a separate arithmetic processor.

The construction and method of operation of the second arithmetic unit RW2, which is not described in any more detail here, for carrying out channel decoding are described in the German Patent Application DE 100 64 102.4, which is herein incorporated by reference.

Figure 3:
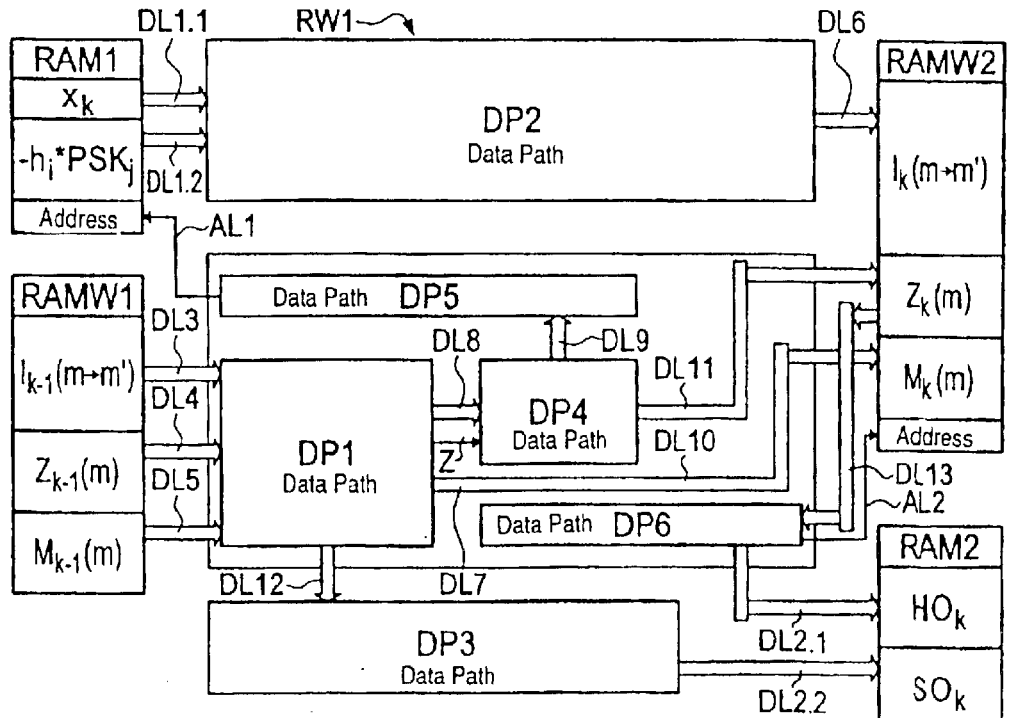
FIG. 3 is a schematic illustration of the hardware data paths in the inventive Viterbi equalizer.

FIG. 3 shows the construction of the first arithmetic unit RW1. This includes the following high-speed hardware data paths:

Data path for carrying out the ACS operations DP1

Data path for calculating transition metrics DP2

Data path for calculating soft output values DP3

Data path for calculating new state vectors DP4

Data path for calculating addresses for partial summands for transition metrics DP5, and Data path for calculating hard-determined data symbols DP6.

Furthermore, FIG. 3 shows the memory contents of the data memories RAM1, RAM2, RAMW1 and RAMW2, as well as the data links which connect the memories RAM1/2, RAMW1/2 to the data paths DP1–6, and connect the data paths DP1–6 to one another.

The data memory RAM1 represents the input data memory for the data path DP2 for the calculation of transition metrics. It contains a first memory area in which the received data symbols $x_k$ are stored, and a second memory area in which products of channel impulse responses and 8PSK data symbol values are stored. Instead of individual products, partial summands of the transition metrics values, including two or more such products, can also be stored in the data memory RAM1.

The memories RAMW1 and RAMW2 each have three memory sections, which contain transition metrics, state vectors and metrics. In this case, the data memory RAMW1 contains the values $I_{k-1}(m \rightarrow m')$, $Z_{k-1}(m)$ and $M_{k-1}(m)$ for the already processed time step k−1 (that is to say the "old" values), while the corresponding newly calculated values $I_k(m \rightarrow m')$, $Z_k(m)$ and $M_k(m)$ are entered in the data memory RAMW2.

The data memory RAM2 is used as the output data memory for the arithmetic unit RW1, and in a first section, stores hard output values $HO_k$ (so-called hard-determined data symbols) and, in a second section, stores soft output values $SO_k$ (that is to say reliability information).

Received data symbols $x_k$ are supplied to the second data path DP2 via a data link DL1.1 from the data memory RAM1, and the transition metrics $I_k(m \rightarrow m')$ which are calculated in the second data path DP2 are output via a second data link DL6. Data links DL3, DL4, DL5 are provided for connecting the memory sections of the data memory RAMW1 to the first data path DP1. The first data path DP1 calculates new metrics and provides these to the appropriate section of the data memory RAMW2 via a data link DL10. Furthermore, the output of the first data path DP1 is connected via a data link DL7 to the sixth data path DP6, and via a data link DL8 and pointer information Z to the fourth data path DP4.

A data link DL9 connects the output of the fourth data path DP4 to the fifth data path DP5. The fifth data path DP5 produces addresses that are passed via an address link AL1 to an address decoder for the data memory RAM1. The addresses call products $-h_i^* PSK_j$, which are stored in the second section of RAM1, have previously been calculated by the DSP, and are then loaded via a data link DL1.2 into the second data path DP2.

Newly calculated metrics $M_k(m)$ are passed via a data link DL10 from the first data path DP1 to the corresponding memory section of the data memory RAMW2. A data link DL11 is used for transmitting new state vectors, calculated in the fourth data path DP4, to the appropriate section of the data memory RAMW2. Furthermore, the sixth data path DP6 has access to the newly calculated states $Z_k(m)$ via a data link DL13.

The hard output values $HO_k$ calculated by the sixth data path DP6 are passed to the data memory RAM2 via a data link DL2.1, and the soft output values $SO_k$ calculated in the third data path DP3 are transmitted via a data link DL2.2 to RAM2.

Figure 4:
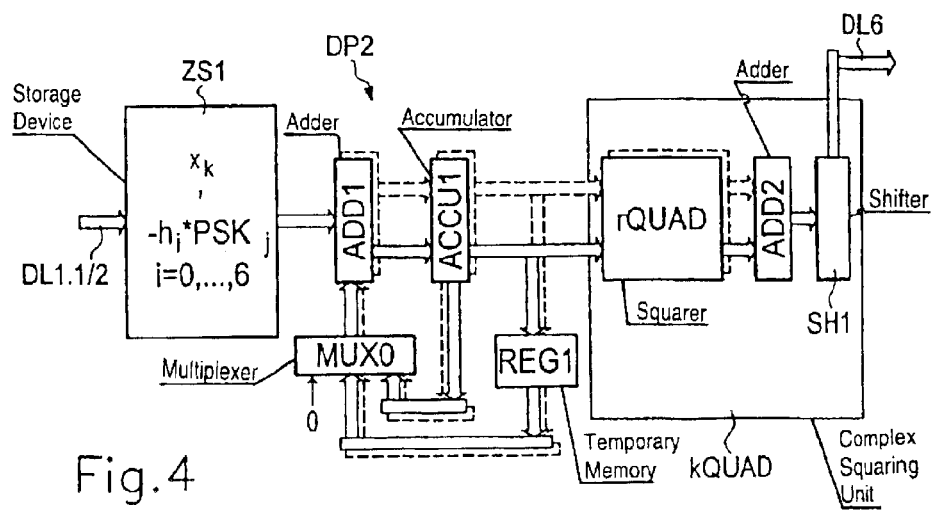
FIG. 4 is a block diagram of an arithmetic unit that provides a data path for calculating transition metrics.

FIG. 4 is a block diagram of the second data path DP2 for calculating the transition metrics. The data path has a buffer storage device ZS1, an adder ADD1, an accumulator ACCU1, a temporary memory REG1 as well as a multiplexer MUX0. The second data path DP2 furthermore contains a complex squaring unit kQUAD, which includes two real squarers rQUAD, an adder ADD2 and a shifter SH1. The output of the shifter SH1 is connected to the data link DL6.

The method of operation of the second data path DP2 will be described in the following text. The second data path DP2 calculates transition metrics in the forward direction using the formula stated in equation 2. The expression in the forward direction means that all the transition metrics (a quantity of 8) are first of all calculated starting from a specific previous state, the next previous state is then considered, and all the transition metrics from this are once again calculated, and so on.

A specific previous state $Z_{k-1}(m)$ with the arbitrary state vector:

PSKg, PSKf, PSKe, PSKd, PSKc, PSKb (where g, f, e, d, c, b=0, . . . , 7) will be used to assist in understanding. The products of these data symbols with the associated channel coefficients are selected via the address link AL1, and are loaded into the buffer storage device ZS1 via the data link DL1.2. Furthermore, the current data symbol $x_k$ is written to the buffer storage device ZS1.

In accordance with equation 2, the eight transition metrics which originate from the previous state under consideration are defined by the expression:

$$|x_k - PSKg^*h_6 - PSKf^*h_5 - PSKe^*h_4 - PSKd^*h_3 - PSKc^*h_2 - PSKb^*h_1 - PSKi_a^*h_0|^2$$

In this case, the data symbol $PSKi_a$ that represents the respective transition can assume all the possible values $PSKi_a$, $i_a=0, \ldots, 7$. This results in the following calculation sequence: when the previous state as mentioned above is selected, the seven products (where $-PSKi_a^*h_0=-PSK0^*h_0$) that are required for calculating the first transition metric are first of all temporarily stored in the buffer storage device ZS1. The adder ADD1 and the accumulator ACCU1 are then used to add the first six products, as predetermined by the previous state, and the received data symbol $x_k$ (it should be mentioned that the products are already stored with a negative mathematical sign in the memory RAM1, so that they do not need to be negated and there is no need to use a subtractor), and this partial sum is then stored in the temporary memory REG1. In a final addition step, the product $-PSKi_a^*h_0=-PSK0^*h_0$ which defines the transition is then added to this, and the corresponding sum is passed to the complex squarer kQUAD1.

It should be mentioned that the adder ADD1, the accumulator ACCU1, the temporary memory REG1 and—as already mentioned—the real squarer rQUAD are in duplicate form, in order to allow processing of the real part and imaginary part of the data symbols. The duplicated configuration of these units is indicated by the dashed lines.

The two real squarers rQUAD respectively square the real part and the imaginary part of the received sums. The squared real part and the squared imaginary part are added in the adder ADD2, and are passed to the shifter SH1. This shifts the received data word by 1 bit, and then outputs this as the first transition metric relating to the previous state under consideration, via the data link DL6.

In order to calculate the next transition metric with— $PSKi_a^*h_0=-PSK1^*h_0$, the partial sum which is stored in the temporary memory REG1 is passed by means of the multiplexer MUX0 to the adder ADD1, where it is added to the product $-PSK1^*h_0$ of the second transition, which now needs to be calculated. The rest of the processing is carried out analogously to the above description, and the calculated transition metric from the previous state under consideration to the target state where m=1 is then once again output via the data link DL6.

The remaining six transition metrics relating to the previous state under consideration are then calculated. A change is then made to the next previous state, and the same procedure is carried out.

It is evident that the calculation of the transition metrics in the forward direction can be carried out with considerably less effort using the second data path DP2 than by calculating the transition metrics in the backward direction, as normally takes place during the processing of the Viterbi algorithm. The reason for this is that, the temporary storage of the product sums and partial sums in the temporary memory REG1 means that only one memory call (for $-PSKi_a^*h_0$) is ever required for calculating the second to eighth transition metrics.

Figure 5:
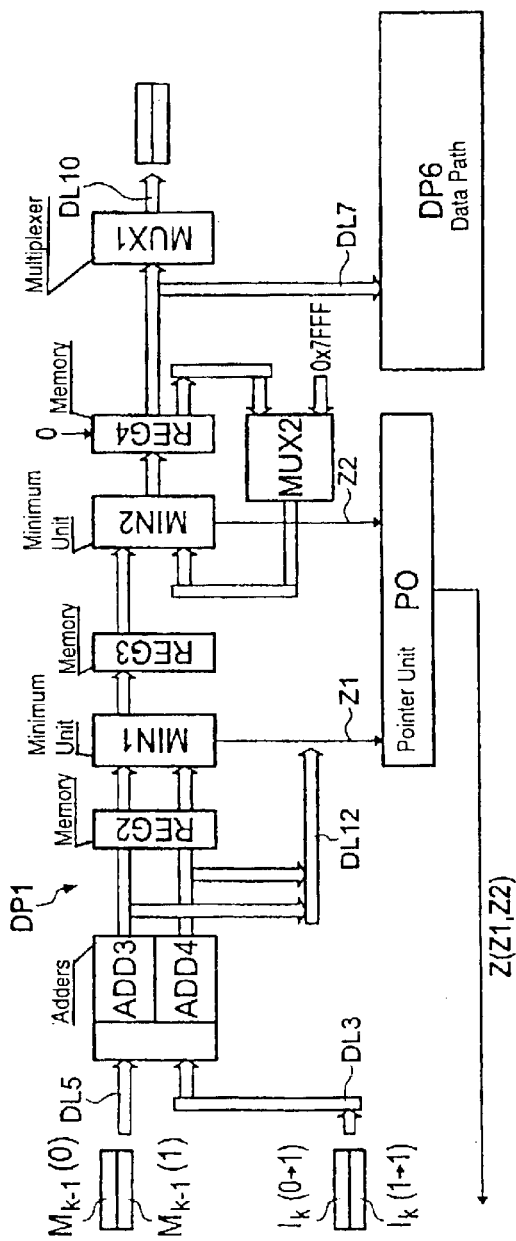
FIG. 5 is a block diagram of an arithmetic unit that provides a data path for carrying out ACS operations.

FIG. 5 shows the configuration of the first data path DP1 for carrying out the ACS operations.

At the input, the data path DP1 has two adders ADD3, ADD4, whose adder outputs are passed to a temporary memory REG2. The temporary memory REG2 is arranged upstream of a first minimum unit MIN1. The output from the first minimum unit MIN1 is passed via a further memory REG3 to a second minimum unit MIN2. The output from the second minimum unit MIN2 is passed to a further temporary memory REG4. The memory contents of REG4 are on the one hand passed to a multiplexer MUX1, and on the other hand are fed back via a multiplexer MUX2 to the second comparison input of the second minimum unit MIN2. The circuit furthermore has a unit PO for producing a pointer Z(Z1, Z2), which is formed from pointer information Z1, Z2 which is output from the minimum units MIN1, MIN2. The input-end data link DL4 is identical to the output-end data link DL8. These data links are not shown in FIG. 5.

The circuit illustrated in FIG. 5 operates as follows:

First of all, the transition metric values calculated by the data path DP2 are moved from RAMW2 to RAMW1. The two adders ADD3, ADD4 are then each supplied via the data links DL5 and DL3 with two metrics for previous states and with the associated two (which have just been recalculated in DP2) transition metrics relating to a specific target state related to the time step k. For the example illustrated in FIG. 1 (in which the target state is m=1), the corresponding metric and transition metric values for the first two transitions (0→1 and 1→1) are shown in FIG. 5.

Each adder ADD3 and ADD4 adds one metric to the associated transition metric, so that two corresponding sum values are output at the output of the adder stage ADD3, ADD4 for each processing step. Both sum values are candidates for the minimum metric that will be calculated for the target state (m=1).

The two sums are called by the first minimum unit MIN1 from the temporary memory REG2 in which they were previously stored, and the smaller of the two sums appears at the output of the first minimum unit MIN1. The pointer information Z1 in this case indicates which of the two transitions under consideration has the minimum sum.

After temporary storage in the temporary memory REG3, this minimum sum is passed to one input of the second minimum unit MIN2, while the other input is first of all set, via the second multiplexer of the MUX2, to a maximum possible value (the value 0×7FFF for a word length, for example, of 16 bits). As a consequence of this, the sum received at the input of the second minimum unit MIN2 is written to the temporary memory REG4.

During this process, the next sums relating to the transitions between the states 2→1 and 3→1 are already being calculated in the adders ADD3, ADD4, and the minimum of these sums is determined in the first minimum unit MIN1. Once again, pointer information Z1 is generated, and the smaller of the two sums is passed to the second minimum unit MIN2. The smaller of the two sums is now compared via the multiplexer MUX2 with the previously determined minimum sum, which is stored in the temporary memory REG4. The memory contents of the temporary memory REG4 are then overwritten by the output from the second minimum unit MIN2, in which case the memory contents are changed or not changed, depending on the result of the minimum formation process. The second pointer information Z2 uses the smaller of the two compared sum values.

It is clear that the minimum sum from the metrics of the previous states and the associated transition metrics is found after four such processing steps. The pointer Z(Z1, Z2) in this case indicates the state vector of the previous state determined in the course of this ACS operation. In FIG. 1, this would be the vector:

PSKii$_4$, PSKii$_3$, PSKii$_2$, PSKii$_1$, PSKii$_0$, PSK4.

The metric, determined in this way, for the target state is loaded into the data memory RAMW2 via the multiplexer MUX1 and the data link DL10.

Figure 8:
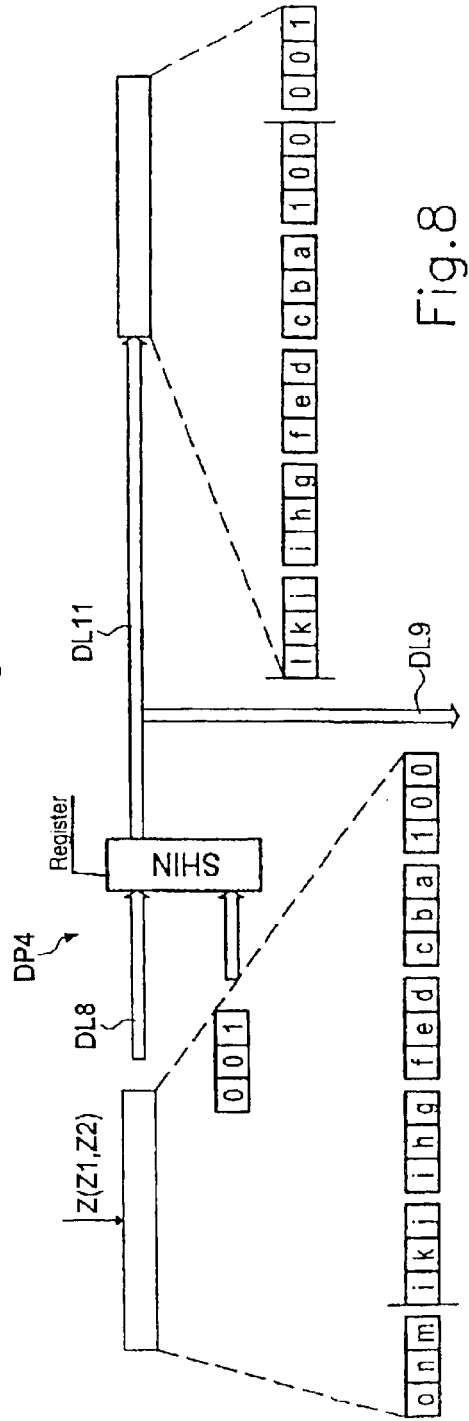
FIG. 8 is a block diagram of an arithmetic unit that provides a data path for calculating a new state vector.

FIG. 8 schematically shows the configuration of the fourth data path DP4 for calculating the new state vector. On the basis of the pointer Z(Z1, Z2) that indicates the state vector of the "correct" previous state $Z_{k-1}$(m) (FIG. 1: state with the index m=4), this is called from the appropriate memory section of the data memory RAMW1 via the data link DL4, DL8. In FIG. 8, a representation of this state vector is chosen which takes account of the fact that each PSK data symbol is coded by a bit triple. This means that the previous state includes the six bit triples 0nm|lkj|ihg|fed|cba|100 shown in FIG. 8.

This state vector is now supplied to a first input of a shift and insertion register SHIN in the data path DP4, while the bit triple (for example 001) which represents the transition PSK symbol is applied to an insertion input of this register SHIN. The shift and insertion register SHIN carries out the operation illustrated graphically in FIG. 8, that is to say the "oldest" bit triple 0 nm is rejected, the other bit triples are shifted to the left, and the transition bit triple 001 is placed at the start of the stored bit word. The state vector formed in this way for the target state is written via the data link DL11 to the appropriate section of the data memory RAMW2.

The addresses for calling the associated products for calculating the transition metric values for the next state transitions, which originate from the just calculated state and end in end states of the time step k+1, are carried out on the basis of the newly defined state vector using the fifth data path DP5. For this purpose, the state vectors determined in the fourth data path DP4 are broken down in the fifth data path DP5 into individual components, which are used as addresses for the products stored in the RAM1 or partial summands of the transition metrics originating from this state to states in the next time step.

Figure 6:
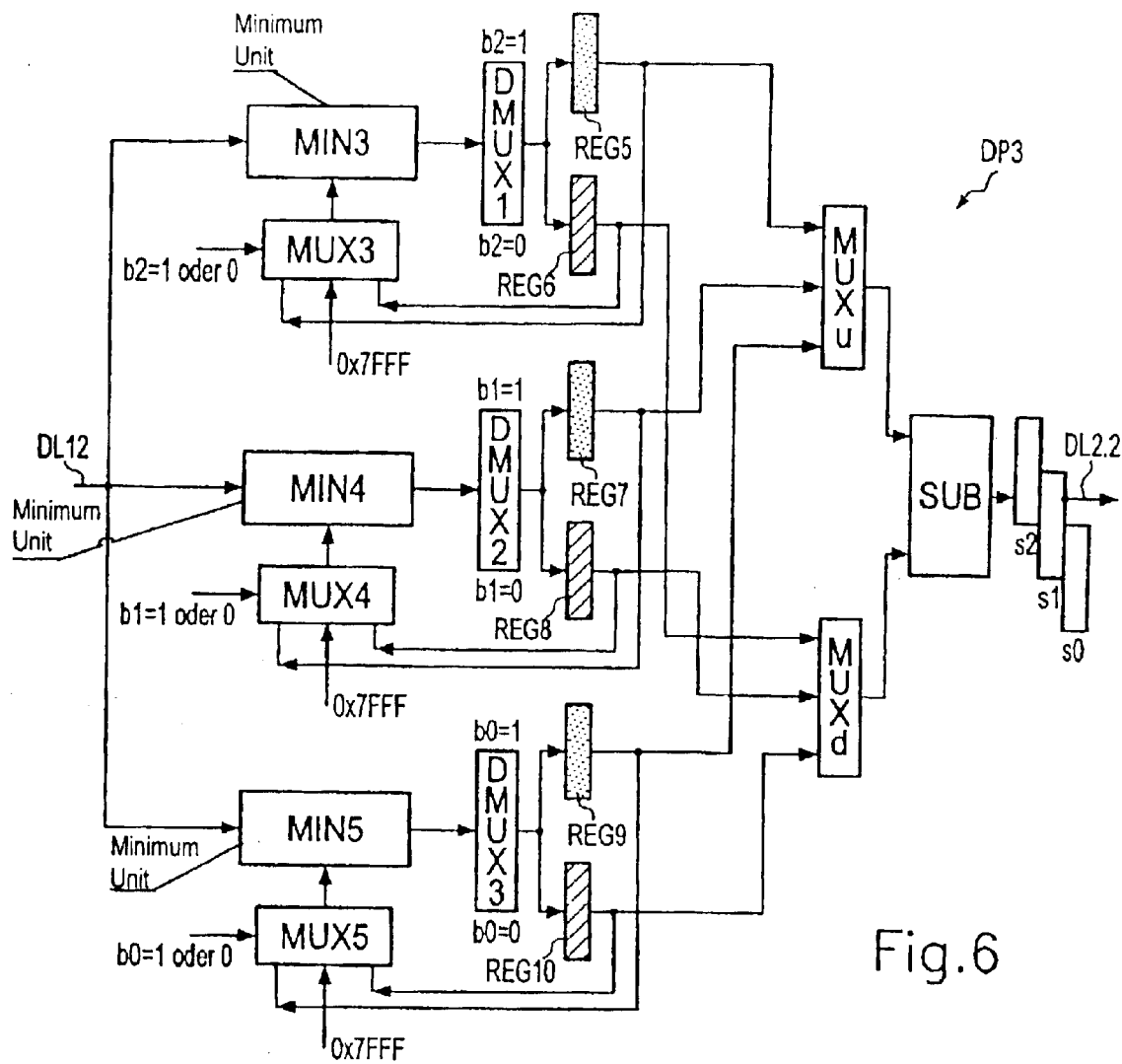
FIG. 6 is a block diagram of an arithmetic unit that provides a data path for calculating soft output values.

FIG. 6 shows the configuration of the third data path DP3 for producing soft output values. The third data path DP3 includes three minimum units MIN3, MIN4, MIN5, which are followed on the output side by respective demultiplexers DMUX1, DMUX2, DMUX3. The demultiplexers DMUX1–3 in each case split the signals for two temporary memories REG5, REG6; REG7, REG8; REG9, REG10. The two outputs of each memory pair REG5, REG6 or REG7, REG8 or REG9, REG10 are passed to multiplexers MUX3, MUX4, MUX5, which in each case form the second input of the corresponding minimum unit MIN3, MIN4 or MIN5.

Furthermore, the outputs of the temporary memories REG5, REG7 and REG9 are connected to the three inputs of a multiplexer MUXu (the u is short for up), and the three outputs of the temporary memories REG6, REG8, REG10 are connected to three inputs of a multiplexer MUXd (d is short for down).

The multiplexer outputs of MUXu, MUXd are passed to a subtractor SUB, which emits three soft bit values s0, s1 and s2 for each data symbol (three bits) at its output.

The method of operation of the third data path DP3 for producing soft output values is as follows:

One 8PSK data symbol is represented by a triple (b0, b1, b2), while bi=0 or 1 for i=0, 1, 2. A confidence value is calculated for each component bi in the 8PSK data symbol for each time step, indicating the probability of the corresponding component of the hard-determined data symbol having the value 1. The soft bit value si relating to the bit bi is calculated using the following equation:

$$si=\min((M_{k-1}(m)+I_k(m\to m')|bi=1)-(M_{k-1}(m)+I_k(m\to m')|bi=0) \text{ for } i=0, 1, 2. \quad (3)$$

The three soft bit values form the soft output value $SO_k$.

It should be mentioned that the soft output values are calculated at the same time that the ACS operations for the time step transition under consideration are being processed. To do this, the minimum units MIN3–5 are continuously supplied with the sums of old metrics and transition metrics via the data link DL12. The demultiplexers DMUX1–3 decide which of the six temporary memories REG5 to REG10 will be used to store the values which occur at the outputs of the minimum units MIN3–5. If b2=1, they are stored in REG5, if b2=0 they are stored in REG6, if b1=1 they are stored in REG7, if b1=0 they are stored in REG8, if b0=1 they are stored in REG9, and if b0=0 they are stored in REG10. The stored sums are then fed back for the next comparison step (which is based on another of the 64 transitions between two adjacent time steps) into the associated minimum unit MIN3–5, with the respective register (REG5 or REG6; REG7 or REG8; REG9 or REG10) being chosen by the multiplexers MUX3–5 depending on the value of the respectively associated bit component b2, b1 or b0. A maximum comparison value (for example 0×7FFF) is used for each time step, in the first minimum formation process.

Since 32 transitions occur for each bit component, the minimization process is carried out on the basis of the equation specified above, over 32 state transitions in each case. After processing all the state transitions relating to one time step, the soft output values for this time step are calculated using the subtractor SUB from the (metric+ transition metric) sums which have been determined recursively in the described manner and are kept available in the temporary memories REG5–10. The multiplexers MUXu and MUXd are in each case operated in the time-division multiplex mode for this purpose. The soft bit values s0, s1, s2 are signed two's complement values, which are supplied to the data memory RAM2 via the data link DL2.2.

Figure 7:
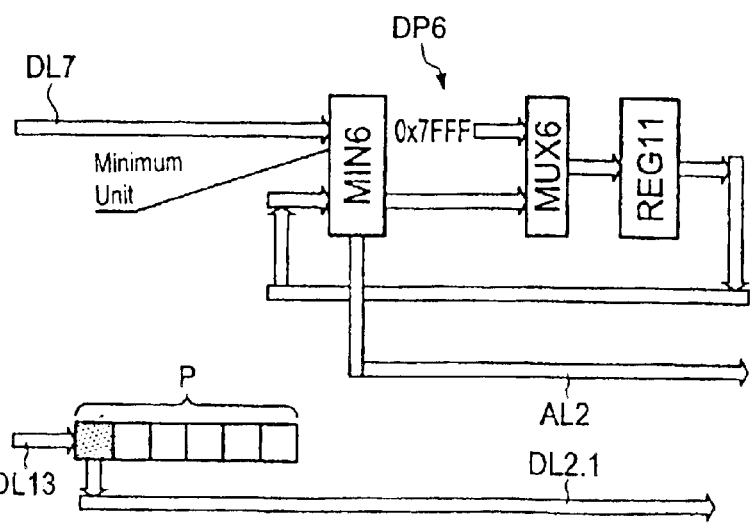
FIG. 7 is a block diagram of an arithmetic unit for calculating hard-determined data symbols.

FIG. 7 shows the configuration of the data path DP6 for calculating hard output values. The data path DP6 essentially includes a minimum unit MIN6, a multiplexer MUX6 and a temporary memory REG11, which are connected in a loop. The loop makes it possible, in the manner already described for other data paths, to determine the minimum value of the new state metrics received via the data link DL7 (which have themselves been found by a minimization procedure in the data path DP1). Since one hard output value is intended to be determined for each time step, the minimization procedure is carried out over all eight newly determined state metrics.

The address of the state vector with the minimum state metric relating to the time step k is passed via the address link AL2 to the address decoder for the data memory RAMW2, as a result of which the appropriate state vector is called via the data link DL13, this being the state vector which, as already described, is composed of the transition data symbols from the respective previous states.

In order to increase the confidence in the hard output value that is emitted, a trace-back operation is carried out, that is to say the transition data symbol determined p time steps in the past is selected, for example p may be chosen to be equal to 6.

It should be mentioned that p>v is possible, that is to say the time for which the trace-back operation goes back may be longer than the channel memory used for calculation of the transition metrics. In this case, longer state vectors including correspondingly more (at least a quantity of p) PSK data symbols have to be used. A state is then furthermore recalculated as illustrated in FIG. 8, but with correspondingly longer state vectors. The use of "longer" state vectors has no influence on the calculation of the transition metrics, since only the last v data symbols and the current transition data symbol are ever taken into account in this case.

The described data paths operate hand in hand, without any intermediate calculations being required in the DSP. The DSP is used essentially only for carrying out the channel estimates and for calculating the products $-h_i*8PSK_j$ (or, in general, partial summands of the transition metric values including one or more such products) and for programming and configuring the hardware arithmetic units RW1 and RW2. The actual calculation procedure is, however, carried out without any involvement by the DSP, so that it need satisfy only moderate performance requirements (<100 MIPS).

The previous description of the method of operation of the arithmetic unit RW1 used the example of EDGE equalization based on 8PSK data symbols. All the data paths DP1 to DP6 may also be used for GSM equalization, however. All that is required to do this is suitably reconfiguring the data paths.

The GSM equalization is based, for example, on a channel memory with a length v=5, that is to say channel coefficients $h_0, h_1, h_2, h_3, h_4, h_5$ are determined by the DSP in course of the channel estimation process.

The transition metrics $I_k(m \rightarrow m')$ are calculated using the following formula:

$$\left| x_k - \sum_{i=0,\ldots,4} h_i * (1 - 2*a_i) - h_5 * (1 - 2*a_5) \right|^2, \quad (4)$$

where $a_i$ are bits, that is to say $a_i=0, 1$ for all $i=0, 1, \ldots, 5$.

A reduced trellis diagram with states in the form $a_1, a_2, a_3, a_4$ is considered. The transition bit is annotated $a_0$, and the bit $a_5$ represents additional information relating to the state under consideration, which is considered only in the course of calculating the transition metrics. Analogously to the notation explained in FIG. 1, a state vector can be represented in the form $a_5, \underline{a}_4, \underline{a}_3, \underline{a}_2, \underline{a}_1$.

Subject to these preconditions, the trellis diagram relating to each time step has $2^4=16$ states. Since each (target) state can be reached via two transitions, there are 32 possible transitions for each time step.

The data path DP2 for calculating the transition metrics may be used without any changes for GSM, since the calculation rule is identical.

The data path DP for calculating the ACS operations is reconfigured such that the temporary memory REG3 and the minimization loop including the minimum unit MIN2, the temporary memory REG4 and the multiplexer MUX2 are omitted. In consequence, there is no pointer information Z2. The pointer information Z=Z1 is only in binary form, and the memory P0 can be bridged.

Only one of the three branches need be activated for the data path DP3 for calculating soft output values, and in consequence, the two multiplexers MUXu and MUXd are deactivated or bridged. This reconfiguration allows the data path DP3 to be used for GSM equalization.

The data paths shown in FIGS. 7 and 8 may likewise be used for GSM purposes. In the data path DP6 (see FIG. 7), the minimization loop must be passed through 16 times, and the shift and insertion register SHIN can still be used in the data path DP4 illustrated in FIG. 8, although the modified definition of the state vector must be taken into account. The same applies to the trace-back operation, illustrated in FIG. 7, in the data path DP6.

I claim:

1. A Viterbi equalizer for equalizing a received 8PSK symbol sequence that has been transmitted via a channel subject to interference, the equalizer comprising a digital signal processor including:
   a first hardware data path configured for carrying out ACS operations and for calculating state metrics of 8PSK target states in a trellis diagram; and
   a second hardware data path configured for taking account of channel characteristics when using the received symbol sequence to calculate transition metrics from 8PSK previous states to the 8PSK target states in the trellis diagram.

2. The Viterbi equalizer according to claim 1, wherein said second hardware data path has a calculation loop for summing products or partial sums from transition metrics values.

3. The Viterbi equalizer according to claim 2, wherein: said calculation loop has a temporary memory for storing a partial sum; and the partial sum can be used for calculating all of the transition metrics values from a specific 8PSK previous state.

4. The Viterbi equalizer according to claim 2, wherein said second hardware data path has at least one squaring stage connected downstream from said calculation loop; and said second hardware data path has at least one further addition stage.

5. The Viterbi equalizer according to claim 1, wherein said second hardware data path has at least one squaring stage connected downstream from said calculation loop; and said second hardware data path has at least one further addition stage.

6. The Viterbi equalizer according to claim 1, wherein said first hardware data path and said second hardware data path are connected directly to one another without any intermediate processing of data therebetween.

7. The Viterbi equalizer according to claim 1, wherein said first hardware data path and said second hardware data path are designed to carry out calculations in accordance with an EDGE mobile radio standard and calculations in accordance with a CSM mobile radio standard.

8. The Viterbi equalizer according to claim 1, comprising a fourth hardware data path for calculating 8PSK target state vectors.

9. The Viterbi equalizer according to claim 8, comprising a fifth hardware data path using an 8PSK state vector obtained from said fourth hardware data path to an 8PSK target state to calculate addresses of partial sums of the transition metrics that originate from the 8PSK target state to 8PSK states in a next time step.

10. The Viterbi equalizer according to claim 1, comprising a further hardware data path for calculating determined 8PSK data symbols.

11. The Viterbi equalizer according to claim 1, comprising:
   a fourth hardware data path for calculating 8PSK target state vectors;
   in order to carry out ACS operations, said first hardware data path including a first minimization stage for determining a minimum of sums from metrics and transition metrics values of at least two state transitions, and a second minimization stage connected downstream from said first minimization stage;
   said second minimization stage configured for determining a minimum by sequential processing; and
   said first minimization stage and said second minimization stage providing pointer information used in said fourth hardware data path for determining a state vector to a target state.

12. The Viterbi equalizer according to claim 11, wherein the pointer information is passed to said fourth hardware data path in order to determine a 8PSK state vector relating to the target state.

13. A Viterbi equalizer for equalizing a received 8PSK symbol sequence that has been transmitted via a channel subject to interference, the equalizer comprising a digital signal processor including:
   a hardware data path configured for carrying out ACS operations and for calculating state metrics of 8PSK target states in a trellis diagram; and
   a hardware data path configured for calculating soft output values for an 8PSK symbol sequence estimated from state transitions that lead to the 8PSK target states.

14. The Viterbi equalizer according to claim 13, wherein said hardware data path for carrying out ACS operations and said hardware data path for calculating soft output values are connected directly to one another without any intermediate processing of data therebetween.

15. The Viterbi equalizer according to claim 13, wherein said hardware data path for carrying out ACS operations and said hardware data path for calculating soft output values are designed to carry out calculations in accordance with an EDGE mobile radio standard and calculations in accordance with a GSM mobile radio standard.

16. The Viterbi equalizer according to claim 13, comprising a further hardware data path for calculating 8PSK target state vectors.

17. The Viterbi equalizer according to claim 16, comprising a hardware data path using an 8PSK state vector obtained from said hardware data path for calculating 8PSK target state vectors to an 8PSK target state to calculate addresses of partial sums of transition metrics that originate from the 8PSK target state to 8PSK states in a next time step.

18. The Viterbi equalizer according to claim 13, comprising a further hardware data path for calculating determined 8PSK data symbols.

19. The Viterbi equalizer according to claim 13, comprising:
   a further hardware data path for calculating 8PSK target state vectors;
   in order to carry out ACS operations, said hardware data path for carrying out ACS operations including a first minimization stage for determining a minimum of sums from metrics and transition metrics values of at least two state transitions, and a second minimization stage connected downstream from said first minimization stage;
   said second minimization stage configured for determining a minimum by sequential processing; and
   said first minimization stage and said second minimization stage providing pointer information used in said further hardware data path for determining a state vector to a target state.

20. The Viterbi equalizer according to claim 19, wherein the pointer information is passed to said further hardware data path in order to determine a 8PSK state vector relating to the target state.

21. The Viterbi equalizer according to claim 13, comprising:
   a hardware data path with at least one calculation loop including a minimum unit with an input, a demultiplexer with an output, two memories connected to said output of said demultiplexer, and a multiplexer;
   said memories having outputs; and
   said multiplexer connecting said outputs of said memories to said input of said minimum unit.

* * * * *